(12) United States Patent
Sumikawa et al.

(10) Patent No.: US 6,362,529 B1
(45) Date of Patent: Mar. 26, 2002

(54) STACKED SEMICONDUCTOR DEVICE

(75) Inventors: Masato Sumikawa, Kashihara; Kazumi Tanaka, Sakai, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/667,587

(22) Filed: Sep. 22, 2000

(30) Foreign Application Priority Data

Oct. 26, 1999 (JP) .......................................... 11-304040

(51) Int. Cl.⁷ ................................................ H01L 29/40
(52) U.S. Cl. ........................ 257/777; 257/723; 257/686
(58) Field of Search ................. 257/777, 723, 257/686, 666

(56) References Cited

U.S. PATENT DOCUMENTS 6,002,177 A * 12/1999 Gaynes et al. .............. 257/686

FOREIGN PATENT DOCUMENTS

| DE | 19918671 A1 | 11/2000 |
| EP | 0915516 A2 | 5/1999 |
| JP | A563137 | 3/1993 |

* cited by examiner

Primary Examiner—Roy Potter (57) ABSTRACT

A stacked semiconductor device includes a plurality of stacked semiconductor chips, each of the semiconductor chips including a penetrating electrode which penetrates from a front surface to a back surface of the semiconductor chip, a first electrode formed on the front surface, a second electrode formed on the back surface and wiring patterns formed on the front and back surfaces for selectively connecting the first and second electrodes through the penetrating electrode, the first electrode of a lower semiconductor chip abutting the second electrode of an upper semiconductor chip with respect to adjacent two of the stacked semiconductor chips.

10 Claims, 9 Drawing Sheets

STACKED SEMICONDUCTOR DEVICE

CROSS-REFERENCE TO RELATED APPLICATION

This application is related to Japanese application No. Hei 11(1999)-304040 filed on Oct. 26, 1999, whose priority is claimed under 35 USC § 119, the disclosure of which is incorporated by reference in its entirety.

BACKGROUND OF THE INVENTION

1. Field of the Invention

The present invention relates to a stacked semiconductor device (e.g., a three-dimensional LSI). In particular, it relates to a structure for mutually and electrically connecting stackable semiconductor chips to be stacked.

2. Description of Related Art

Today, a complex semiconductor device or module combining a plurality of semiconductor chips (LSI chips) and connecting them to a circuit board using a wire bonding method is generally used to fill demands for greater functions.

However, such a device may delay a signal transmitted among the plural semiconductor chips depending on the length of wirings connecting them so that it cannot sufficiently keep up with improvement in operation speed of the semiconductor chips.

For such a problem, shortening the wirings in the complex semiconductor device as much as possible is an effective solution. Accordingly, a flip-chip bonding method is generally employed to directly connect electrodes of the semiconductor chips to the circuit board instead of the wire bonding method.

However, the signal transmission may possibly be delayed even in the flip-chip bonded device because the signal among the semiconductor chips is transmitted through the circuit board.

As a solution of this problem, a semiconductor device formed by stacking semiconductor chips on each other is commonly known as a three-dimensional LSI (see Japanese Unexamined Patent Publication No. HEI 5(1993)-63137, for example).

In such a stacked semiconductor device, the semiconductor chips are mutually connected in the following manner.

First, through holes are partially formed in the semiconductor chip and a conductive material is filled in the through holes to form penetrating electrodes, which are exposed on the front and back surfaces of the semiconductor chip. The penetrating electrodes define bump electrodes (projecting electrodes) or pad electrodes on end surfaces thereof.

Then, the bump (or pad) electrodes of one semiconductor chip abut those of another semiconductor chip to mutually connect the two chips.

However, the stacked semiconductor devices of the prior art have been suffering from the following drawbacks.

1) The stacked semiconductor chips are connected with each other through series of penetrating electrodes which are put on top of each other, so that only one signal can be transmitted through one series of penetrating electrodes. This prevents the flexibility in design of the wirings for connecting the semiconductor chips.

2) The electrodes of the stacked semiconductor chips are formed only on necessary regions according to the required function. Therefore the arrangement of the electrodes must be designed for every semiconductor device. This makes production efficiency poor when various types of stacked semiconductor devices are produced.

SUMMARY OF THE INVENTION

The present invention has been achieved in view of these circumstances, and provides a stacked semiconductor device having improved flexibility in design of the wirings for connecting the semiconductor chips. It is free from necessity to change the arrangement of the electrodes connecting between the semiconductor chips for every semiconductor device, by separately forming a penetrating electrode and a bump or pad electrode in each of the stacked semiconductor chips and selectively connecting the electrodes to each other through an optional wiring pattern. According to this, the production efficiency is improved when various types of stacked semiconductor devices are produced.

The present invention provides a stacked semiconductor device comprising: a plurality of stacked semiconductor chips, each of the semiconductor chips including a penetrating electrode which penetrates from a front surface to a back surface of the semiconductor chip, a first electrode formed on the front surface, a second electrode formed on the back surface and wiring patterns formed on the front and back surfaces for selectively connecting the first and second electrodes through the penetrating electrode, the first electrode of a lower semiconductor chip abutting the second electrode of an upper semiconductor chip with respect to adjacent two of the stacked semiconductor chips.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the stacked semiconductor device of the present invention, each of the first and second electrodes may include a plurality of electrodes arranged in a predetermined arrangement pattern.

More specifically, the predetermined arrangement pattern may be a matrix pattern.

The first electrode may be a bump electrode (projecting electrode) and the second electrode may be a pad electrode.

The semiconductor chip used in the present invention may be an LSI chip or an IC chip made of a semiconductor substrate of Si, GaAs, CdTe and the like on which a desired circuit pattern has been formed.

The first and second electrodes may be made of Al, Cu, Au, Cr, In, Sn, Sn/Pb alloy, Sn/Ag alloy and the like.

Hereinafter, the present invention will be further detailed in the following embodiments with reference to the drawings. However, the present invention is not limited thereto. In this specification, "connect" and "connection" mean "electrically connect" and "electrical connection", respectively.

Embodiment 1

Embodiment 1 of the present invention will be described with reference to FIGS. 1 to 5.

Figure 1:
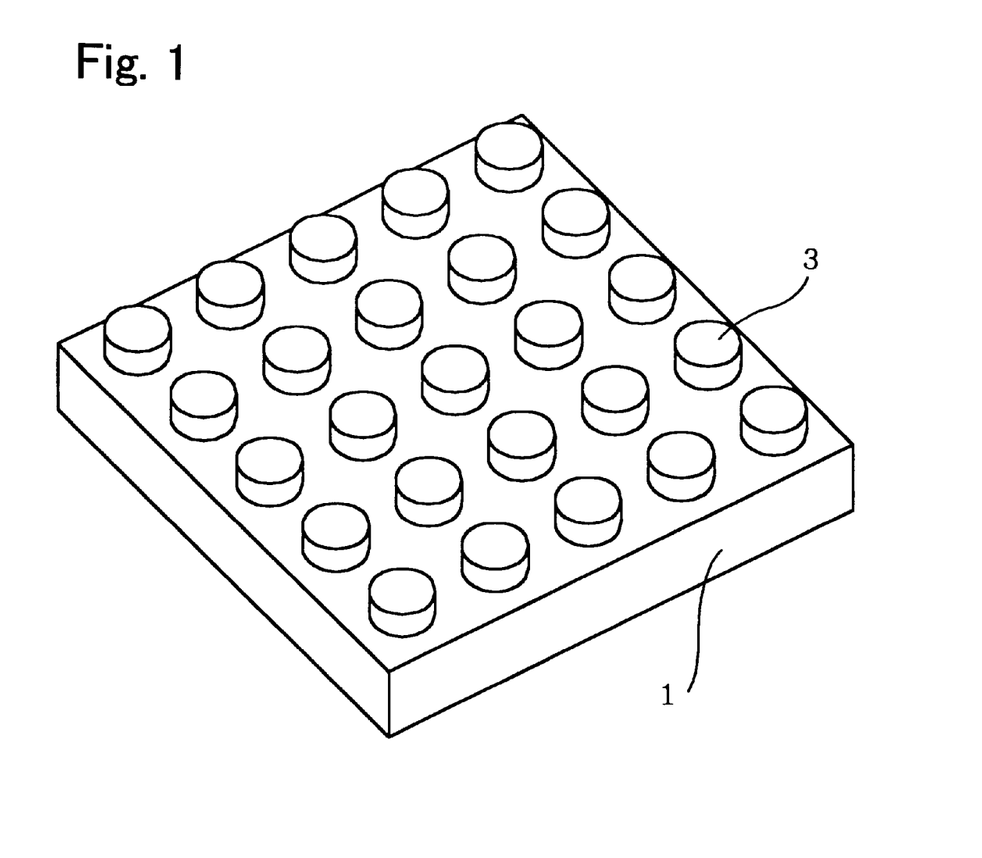
FIG. 1 is a perspective view illustrating a semiconductor chip according to Embodiment 1 which constitutes a stacked semiconductor device of the present invention.
Figure 2:
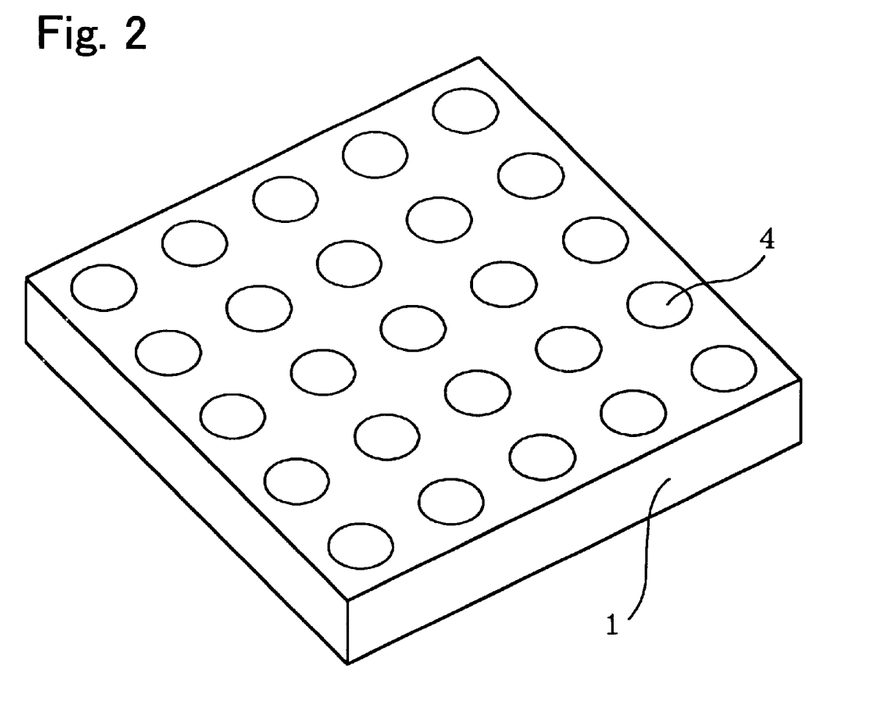
FIG. 2 is a perspective view of the semiconductor chip of FIG. 1 observed from a back surface.
Figure 3:
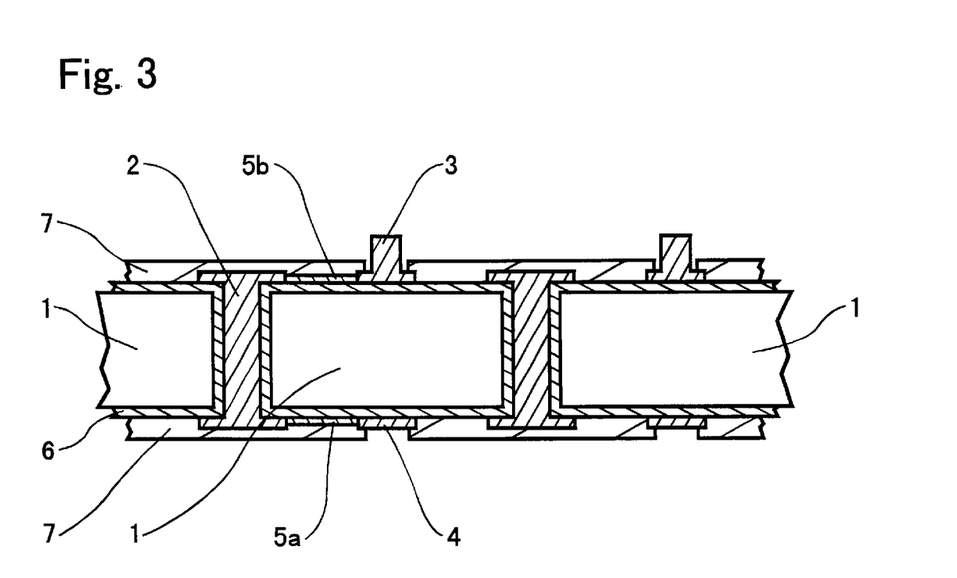
FIG. 3 is an enlarged sectional view illustrating a major part of the semiconductor chip of FIG. 1.

FIG. 1 is a perspective view of a semiconductor chip which constitutes the stacked semiconductor device of the present invention and which is observed from a front surface, FIG. 2 is a perspective view of the same viewed from a back surface, and FIG. 3 is an enlarged sectional view of a major part thereof.

As seen in FIGS. 1 to 3, a semiconductor chip 1 to constitute a stacked semiconductor device (not shown) includes a penetrating electrode 2 which penetrates the semiconductor chip 1, a bump electrode (first electrode) 3 provided on the front surface of the semiconductor chip 1, a pad electrode (second electrode) 4 provided on the back surface of the semiconductor chip 1, and wiring patterns 5a and 5b provided on the front and back surfaces of the semiconductor chip 1, respectively, for selectively connecting the bump electrode 3 and the pad electrode 4 through the penetrating electrode 2.

In the present invention, the semiconductor chip which constitutes the stacked semiconductor device is formed as described above.

Then, by stacking the semiconductor chips, the bump electrode formed on a lower semiconductor chip abuts on the pad electrode formed on an upper semiconductor chip. That is, the lower semiconductor chip and the upper semiconductor chip are mutually connected.

As seen in FIG. 3 in particular, the bump electrode 3 on the front surface of the semiconductor chip 1 and the pad electrode 4 on the back surface thereof are formed oppositely to each other.

The penetrating electrode 2 is separate from the bump electrode 3 and the pad electrode 4. The penetrating electrode 2 is not connected directly to the bump electrode 3 and the pad electrode 4, but connected through the wiring patterns 5a and 5b.

The left side of FIG. 3 shows the connection between the pad electrode 4 and the bump electrode 3 through the penetrating electrode 2, in which the wiring pattern 5a is formed between the pad electrode 4 and the penetrating electrode 2, and the wiring pattern 5b is formed between the bump electrode 3 and the penetrating electrode 2.

As described later, where to form the wiring patterns 5a and 5b is determined depending on the desired design of the wirings of the stacked semiconductor chips.

Therefore, the wiring patterns 5a and 5b are not necessarily arranged as seen in FIG. 3.

In FIG. 3, reference numeral 6 denotes an insulating film for breaking the connection of the semiconductor chip 1 with the penetrating electrode 2, the bump electrode 3, the pad electrode 4 and the wiring patterns 5a and 5b. Reference numeral 7 denotes a protective film for the semiconductor chip 1.

The protective film 7 is provided on the front and back surfaces of the semiconductor chip 1 except regions for forming the bump electrodes 3 and the pad electrodes 4 so that the electrodes 3 and 4 are exposed.

As shown in FIG. 1, the bump electrodes 3 are arranged in matrix with a certain pitch on the front surface of the semiconductor chip 1. As shown in FIG. 2, the pad electrodes 4 are also arranged in matrix on the back surface of the semiconductor chip 1.

Figure 4:
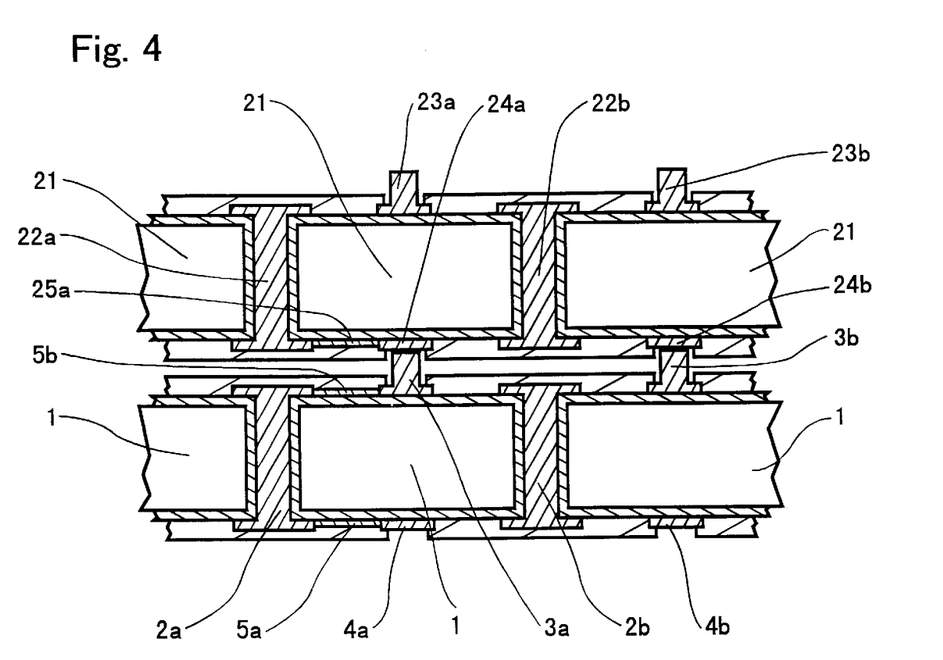
FIG. 4 is a view illustrating the semiconductor chip of FIG. 1 on which a semiconductor chip of the same construction is stacked.
Figure 5:
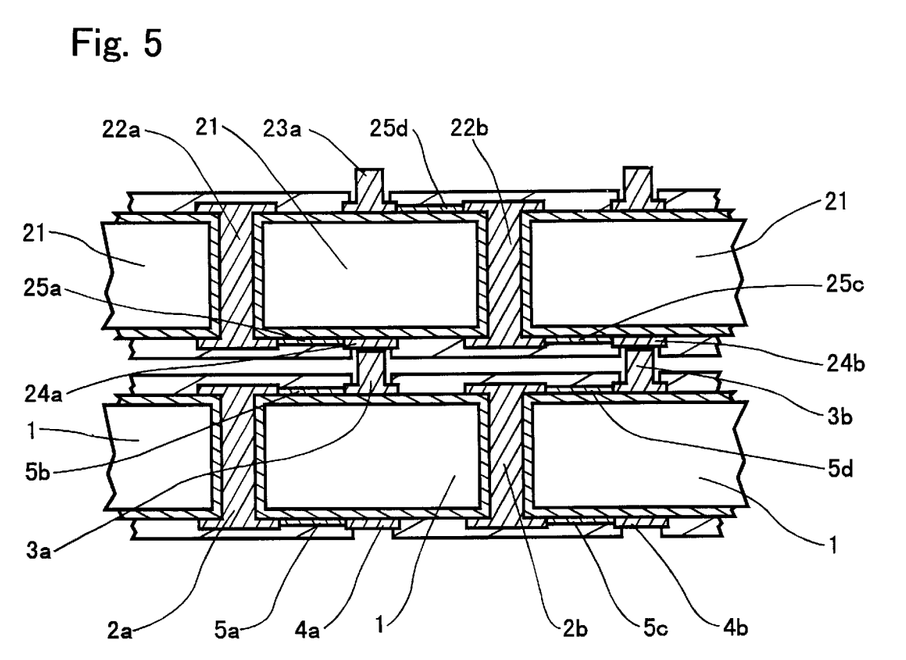
FIG. 5 is a view illustrating the semiconductor chip of FIG. 1 on which a semiconductor chip of the same construction is stacked.

Referring to FIGS. 4 and 5, explanation will be given on how the semiconductor chips of FIGS. 1 to 3 are stacked and connected.

As shown in FIG. 4, the semiconductor chip 1 and a semiconductor chip 21 both having the electrodes of the same construction and arrangement are stacked. In this case, a signal input from a pad electrode 4a of the semiconductor chip 1 is transmitted to a penetrating electrode 22a of the semiconductor chip 21.

In this case, the pad electrode 4a and a bump electrode 3a of the semiconductor chip 1 need to be conducted. Therefore, the pad electrode 4a and a penetrating electrode 2a are connected via the wiring pattern 5a, and the penetrating electrode 2a and the bump electrode 3a are connected via the wiring pattern 5b.

In the semiconductor chip 21 stacked on the semiconductor chip 1, a pad electrode 24a which abuts the bump electrode 3a of the semiconductor chip 1 is connected to the penetrating electrode 22a via a wiring pattern 25a.

The bump electrodes 3a and 3b of the semiconductor chip 1 and the pad electrodes 24a and 24b of the semiconductor chip 21 are adhered to each other, respectively, by melting the electrode material by heat, by destroying a surface barrier film by external forces for solid phase diffusion, or by hardening and shrinking a resin filled between the chips for press bonding.

By stacking and connecting as described above, a signal input from a circuit board or another semiconductor chip (not shown) located below the semiconductor chip 1 to the pad electrode 4a is transmitted to the penetrating electrode 22a of the upper semiconductor chip 21 through the wiring pattern 5a, the penetrating electrode 2a, the wiring pattern 5b, the bump electrode 3a, the pad electrode 24a and the wiring pattern 25a.

The signal transmitted to the penetrating electrode 22a is then transmitted to an internal circuit (not shown) of the semiconductor chip 21 through a circuit (not shown).

FIG. 5 shows the stacked and connected semiconductor chips in which different signals are input to the pad electrodes 4a and 4b of the lower semiconductor chip 1, respectively.

The signal input to the pad electrode 4a is transmitted to the penetrating electrode 22a of the upper semiconductor chip 21 through the wiring pattern 5a , the penetrating electrode 2a, the wiring pattern 5b, the bump electrode 3a, the pad electrode 24a and the wiring pattern 25a in a similar manner to the case of FIG. 4.

On the other hand, the signal input to the pad electrode 4b is transmitted to a bump electrode 23a of the upper semiconductor chip 21 through a wiring pattern 5c, a penetrating electrode 2b, a wiring pattern 5d, the bump electrode 3b, the pad electrode 24b, a wiring pattern 25c, a penetrating electrode 22b and a wiring pattern 25d, and then further transmitted to a semiconductor chip stacked thereon (not shown).

That is, in the present invention, the electrodes are arranged in a certain pattern (matrix pattern, for example) whether they are used for connecting the semiconductor chips or not, and the wiring pattern is formed only between the electrodes required for connecting the semiconductor chips.

According to this, design of the wirings for connecting the semiconductor chips becomes more flexible. Further, a drastic change in the arrangement of the electrodes connecting the semiconductor chips for every semiconductor device is not required. Thus, the production efficiency is improved when various types of stacked semiconductor devices are produced.

Embodiment 2

Embodiment 2 of the present invention will be explained with reference to FIGS. 6 and 7.

Figure 6:
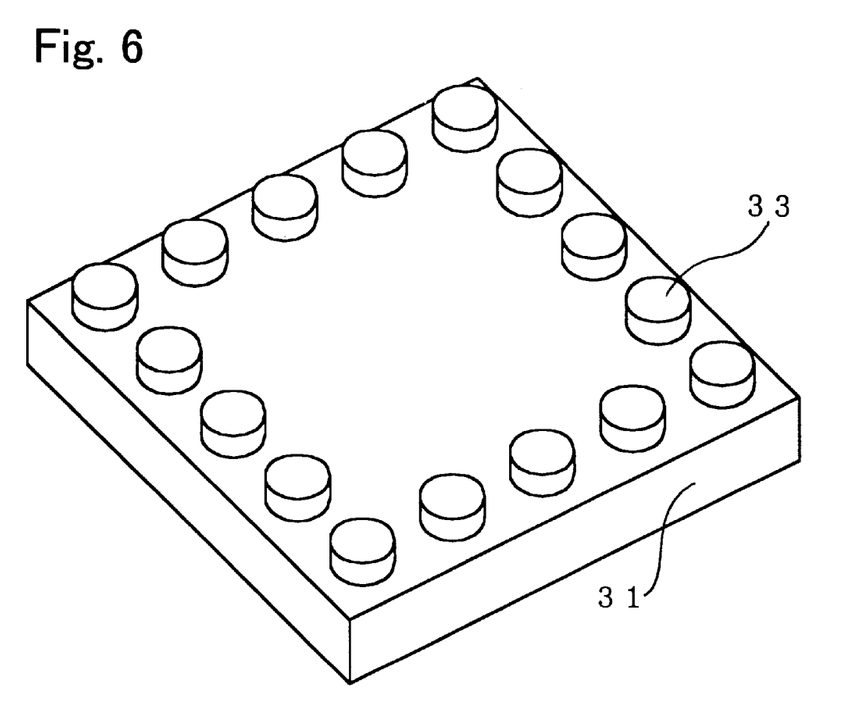
FIG. 6 is a perspective view illustrating a semiconductor chip according to Embodiment 2 which constitutes the stacked semiconductor device of the present invention.
Figure 7:
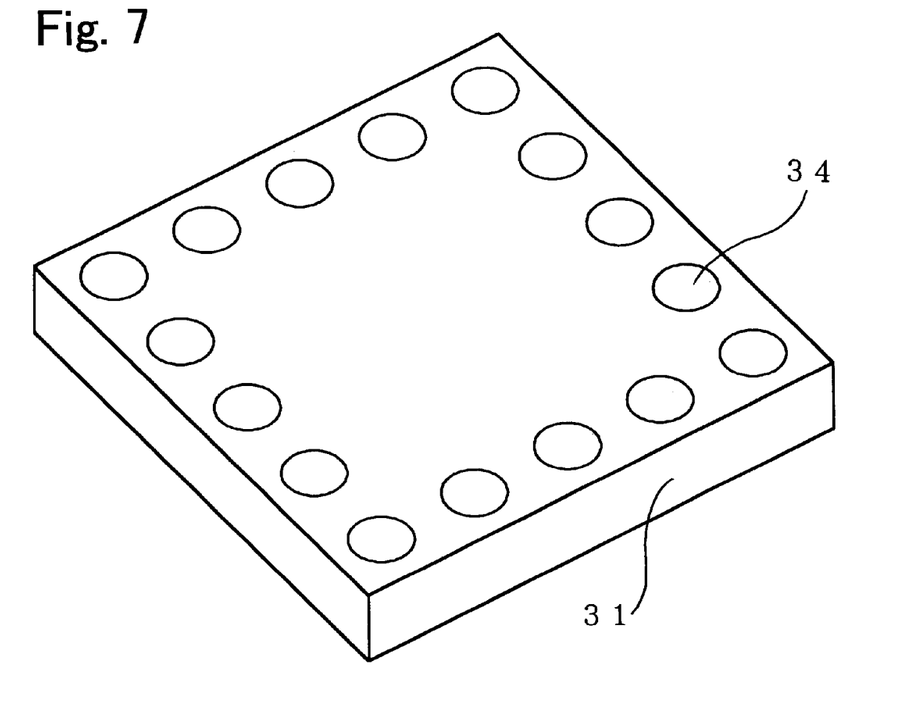
FIG. 7 is a perspective view of the semiconductor chip of FIG. 6 observed from a back surface.

FIG. 6 is a perspective view of a semiconductor chip 31 which constitutes the semiconductor device of the present invention and which is observed from the front surface, and FIG. 7 is a perspective view of the same viewed from the back surface.

As shown in FIG. 6, bump electrodes 33 are arranged on the front surface of the semiconductor chip 31 along the periphery of the chip with a certain pitch.

As shown in FIG. 7, pad electrodes 34 are arranged on the back surface of the semiconductor chip 31 oppositely to the bump electrodes 33 on the front surface.

That is, in contrast with the semiconductor chip 1 of Embodiment 1 shown in FIGS. 1 and 2 including the electrodes arranged in matrix, the semiconductor chip 31 shown in FIGS. 6 and 7 includes the electrodes formed only on the periphery portion thereof.

Other construction than the above is the same as that of the semiconductor chip 1 of Embodiment 1 (FIG. 3).

Embodiment 3

Embodiment 3 of the present invention will be described with reference to FIGS. 8 and 9.

Figure 8:
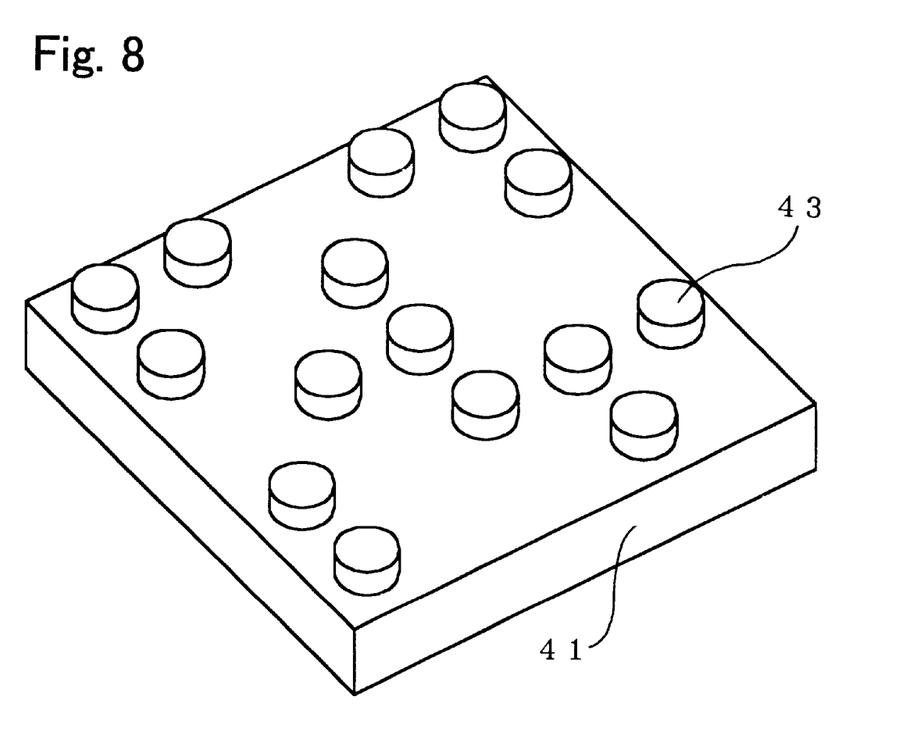
FIG. 8 is a perspective view illustrating a semiconductor chip according to Embodiment 3 which constitutes the semiconductor device of the present invention.
Figure 9:
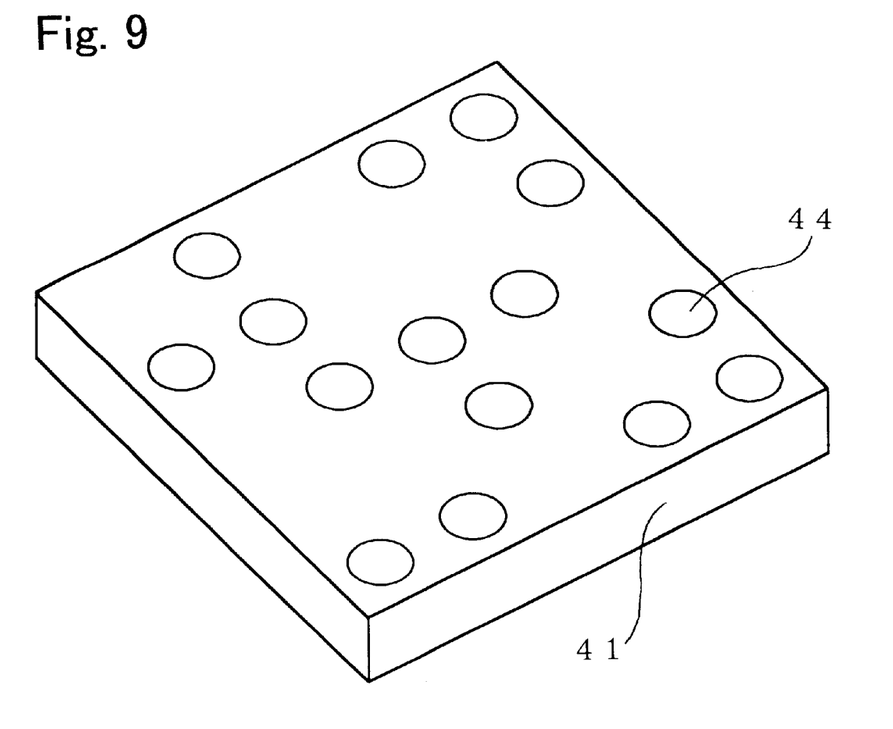
FIG. 9 is a perspective view of the semiconductor chip of FIG. 8 observed from a back surface.

FIG. 8 is a perspective view of a semiconductor chip 41 which constitutes the semiconductor device of the present invention and which is observed from the front surface, and FIG. 9 is a perspective view of the same viewed from the back surface.

The semiconductor chip 41 shown in FIGS. 8 and 9 has electrodes arranged in a manner that the electrodes unnecessary for the connection are removed from the matrix electrodes on the semiconductor chip 1 of Embodiment 1 shown in FIGS. 1 and 2.

Other construction than the above is the same as that of the semiconductor chip 1 of Embodiment 1 (FIG. 3).

The semiconductor chip 41 shown in FIGS. 8 and 9 includes the electrodes arranged so that it can be connected to the semiconductor chip 1 of Embodiment 1 by stacking.

As mentioned above, Embodiment 1 arranges the electrodes in matrix, Embodiment 2 forms the electrodes on the periphery portion of the semiconductor chip, and Embodiment 3 forms the electrodes on the required optional positions.

If the electrode arrangements as described above are standardized, the advantage of the present invention will be more significantly exhibitted. That is, if a standard electrode arrangement is established, the arrangements of electrodes on various semiconductor chips obtained from different suppliers will be consistent each other.

Therefore, an intended stacked semiconductor device can be obtained only by forming desired wirings on a plurality of semiconductor chips manufactured by the other supplier and stacking them.

Further, since the combination of the semiconductor chips to be stacked can readily be altered, stacked semiconductor devices having different functions can efficiently be produced.

According to the present invention, design of the wirings for connecting the semiconductor chips becomes more flexible and a drastic change in the electrode arrangement for every semiconductor device is not required. Thus, the production efficiency is improved when various types of the stacked semiconductor devices are produced.

What is claimed is:

1. A semiconductor device comprising:

a plurality of stacked semiconductor chips including upper and lower chips adjacent to each other, each of the semiconductor chips including a plurality of penetrating electrodes which penetrate from a front surface to a back surface of each semiconductor chip, a plurality of first electrodes formed on the front surface, a plurality of second electrodes formed on the back surface, and wiring patterns formed on the front and back surfaces for selectively connecting the first and second electrodes through the penetrating electrodes, wherein each of the first and second electrodes is arranged separately from the penetrating electrodes, and the first electrodes of the lower semiconductor chip abut the second electrodes of the upper semiconductor chip.

2. A semiconductor device according to claim 1, wherein the first and second electrodes are arranged in a predetermined arrangement pattern.

3. A semiconductor device according to claim 2, wherein the predetermined arrangement pattern is a matrix pattern.

4. A semiconductor device according to claim 1, wherein each of the first electrodes is a bump electrode and each of the second electrodes is a pad electrode.

5. A semiconductor device according to claim 2, wherein the predetermined arrangement pattern is a perimeter pattern.

6. A semiconductor device according to claim 2, wherein the predetermined arrangement pattern is an arbitrary pattern.

7. A semiconductor device according to claim 2, wherein the predetermined arrangement pattern is an asymmetric pattern.

8. A semiconductor device according to claim 2, wherein the predetermined arrangement pattern is symmetric pattern.

9. A semiconductor device according to claim 1, wherein at least one of the first and second electrodes is protruded.

10. A semiconductor device according to claim 4, further comprising a protective film laminated on each of the front and back surfaces of the semiconductor chips except the bump electrodes and the pad electrodes so that the bump electrodes and the pad electrodes are exposed.

* * * * *